United States Patent [19]

Suzuki et al.

[11] Patent Number: 5,209,819
[45] Date of Patent: May 11, 1993

[54] PROCESS FOR PRODUCING MOLDING FOR PRECISION FINE-LINE CIRCUIT

[75] Inventors: Yoshiharu Suzuki, Chiba; Tomoyuki Aketa, Shizuoka, both of Japan

[73] Assignee: Polyplastics Co., Ltd., Osaka, Japan

[21] Appl. No.: 547,237

[22] Filed: Jul. 3, 1990

[30] Foreign Application Priority Data

Jul. 3, 1989 [JP] Japan .................. 1-171368

[51] Int. Cl.$^5$ .............................................. H05K 3/00
[52] U.S. Cl. .................... 156/656; 156/668; 156/901; 427/307
[58] Field of Search .............. 156/668, 656, 901; 427/307; 264/108, 225

[56] References Cited

U.S. PATENT DOCUMENTS

| 4,101,402 | 7/1978 | Vossen, Jr. et al. | |
|---|---|---|---|
| 4,455,207 | 6/1984 | Sartor et al. | |
| 4,582,564 | 4/1986 | Shanefield et al. | 427/307 X |
| 4,615,763 | 10/1986 | Gelorme et al. | 427/307 X |
| 4,705,592 | 11/1987 | Bahrle et al. | |
| 4,714,631 | 12/1987 | Aufderheide | |
| 4,764,327 | 8/1988 | Nozaki et al. | 264/225 |
| 4,795,660 | 1/1989 | Cooray et al. | |
| 4,816,124 | 3/1989 | Manabe et al. | |
| 4,826,720 | 5/1989 | Wade | |
| 4,943,606 | 7/1990 | Inoue et al. | |
| 4,950,360 | 8/1990 | Murao et al. | 427/307 X |
| 4,997,724 | 3/1991 | Suzuki et al. | 427/307 X |
| 5,059,368 | 10/1991 | Allan et al. | 264/108 |

FOREIGN PATENT DOCUMENTS

| 3014879 | 1/1988 | Japan | 427/307 |
|---|---|---|---|
| 1268874 | 10/1989 | Japan | 427/307 |

Primary Examiner—Thi Dang
Attorney, Agent, or Firm—Burns, Doane, Swecker & Mathis

[57] ABSTRACT

A molding capable of forming a precision fine-line circuit by the substractive method is produced by an improvement that a molding prepared by molding a liquid-crystal polyester resin composition comprising a melt-processable polyester (liquid-crystal polyester) capable of forming an anisotropic molten phase and an inorganic filler added thereto is etched and then treated to form a metallic coating on the surface thereof by sputtering, ion plating or vacuum deposition.

21 Claims, No Drawings

PROCESS FOR PRODUCING MOLDING FOR PRECISION FINE-LINE CIRCUIT

The present invention relates to a process for forming a metallic coating on the surface of a molding which is prepared by molding a resin composition comprising a melt-processable polyester capable of forming an anisotropic molten phase (hereinafter referred to as the "liquid-crystal polyester") and which gives a molding capable of forming a precision fine-line circuit by the subtractive method and also to the molding produced by this process.

In particular, the present invention relates to a process for producing a molding capable of forming a precision fine-line circuit by the subtractive method, wherein a molding prepared by molding a liquid-crystal polyester resin composition having excellent heat resistance and moldability can be efficiently coated to form a metallic coating on the surface thereof, and the molding thus produced.

BACKGROUND OF THE INVENTION

The liquid-crystal polyesters are rigid polymers unlike well-known thermoplastic polyesters such as polybutylene terephthalate or polyethylene terephthalate, and their molecular chains are difficultly bendable and keep their rodlike shapes even in a molten state. Therefore, the molecules are entangled with each other only to a small extent even in a molten state and oriented in one direction by even only a slight shearing force. They are thus crystalline even in the liquid form, namely, they are liquid crystals.

Although the liquid-crystal polyester can be molded by an ordinary injection molding process and has excellent moldability, heat resistance and dimensional stability, it has a defect that the surface layer of a molding prepared from it peels off to cause a fuzzing due to the strong orientation thereof. Thus it cannot be subjected to a surface processing such as vacuum deposition, ion plating or sputtering.

Although it might be thought possible to roughen its surface by pretreatment with a chemical used for treating ordinary resins, the surface of the molding thus prepared is chemically quite inert and has no affinity with any solvent. Thus it is impossible to roughen the surface by removing the oriented surface layer. Another method of roughening the surface comprises adding an inorganic filler for weakening the strong orientation of the liquid-crystal polyester resin or an additive which can be easily leached and treating the surface with a strong acid or alkali solution. However, when a conductive circuit is formed on the etched surface by, for example, wet plating according to electroless plating, a fragile oxide film is formed between the metallic coating and the material by water incorporated in the wet step and impurities contained in the solution used for the treatment, thereby reducing the adhesion of the metallic coating to the material. Thus, a higher surface roughness is necessary to obtain a higher adhesion. In this case, a resist ink for forming a circuit pattern is attached to only part of the surface because of the unevenness of the surface of the base plate entirely coated with the metal, and in the pattern-sticking method with a dry film, the adhesion of the film to the base plate is poor. Since the thickness of the metallic coating formed on a highly rough surface is uneven, the formation of a precision fine-line circuit by the subtractive method is difficult.

When a metallic coating is directly formed on a base plate improved in only orientation by vacuum deposition, sputtering or ion plating, the adhesion of the coating is poor, though a smooth surface can be obtained. Thus this process is impractical. Particularly when an ordinary thermoplastic resin is subjected to vacuum deposition, sputtering or ion plating, a gas is generated in too large an amount from the base material in vacuo to allow a metallic coating having excellent properties to adhere to the resin firmly. Although the liquid-crystal polyester is substantially free from the problem of the gas formation, no metallic coating can be firmly adhered thereto for the above-described reasons. Even when a precision fine-line circuit is to be formed by the subtractive method on a board prepared by adding an inorganic filler readily soluble in an acid or alkali to the resin, etching the resulting resin with the acid or alkali and subjecting the etched resin to an ordinary electroless plating to form a metallic coating on the entire surface, the minimum possible line width is 0.30 mm and the minimum possible space width is 0.30 mm in a circuit produced by the conventional process. In addition, when the surface roughness is improved in order to increase the fineness of the lines, the adhesion of the coating film thereto is reduced impracticably.

The terms "line width" and "space width" as used herein refer to the width of each line of the circuit and the space between the lines adjacent to each other, respectively.

The liquid-crystal polyester has features such as a low coefficient of linear expansion comparable to the coefficient of thermal linear expansion of an ordinary metal and a thermal resistance which causes no trouble even when it is dipped in a soldering bath at 260° C. for 10 sec. No satisfactory process has been found yet, though investigations have been made for the purpose of developing a process for coating the surface of a molding with a metal in order to improve the above-described surface properties and to produce parts jointed to a metal with an adhesive or molding plated with a metal, taking advantage of these properties of the liquid-crystal polyester.

SUMMARY OF THE INVENTION

After intensive investigations made for the purpose of developing a process for producing a molding suitable for forming a precision fine-line circuit by the subtractive method by forming a metallic coating closely adherent to the surface without impairing the physical and physical and chemical properties of the liquid-crystal polyester and also without forming any easily peelable surface layer, taking advantage of the advantageous thermal properties of the liquid-crystal polyester, the inventors have found that a firmly adherent metallic coating can be formed on the surface of a molding made of a composition comprising a liquid-crystal polyester and an inorganic filler added thereto when the molding is etched, dried by dehydration and surface-treated by sputtering, ion plating or vacuum deposition. By this process, a precision fine-line circuit more excellent than that produced by a conventional process can be obtained according to the subtractive method. The present invention has been completed on the basis of this finding.

Thus the present invention provides a process for producing a molding capable of forming a precision fine-line circuit by the subtractive method, characterized in that a molding prepared by molding a liquid-crystal polyester resin composition comprising a melt-processable polyester (liquid-crystal polyester) capable of forming an anisotropic molten phase and an inorganic filler added thereto is etched and then treated to form a metallic coating on the surface thereof by sputtering, ion plating or vacuum deposition.

DESCRIPTION OF PREFERRED EMBODIMENTS

The subtractive method for forming a circuit herein comprises coating or laminating the entire surface of a molding with a conductive material such as a metal, coating those parts of the surface which are necessary for forming a conductor pattern based on the circuit design with an acidproof material serving as an etching resist, dissolving the metal in the conductor pattern-free parts which are not coated with any etching resist in an etching solution in which the metal is soluble and removing the etching resist by dissolving it in a chemical to expose the conductor pattern, thus forming a circuit.

The inorganic filler used in the present invention is preferably one or more inorganic fillers selected from the group consisting of the Group II elements of the periodic table and their oxides, sulfates, phosphates, silicates and carbonates or the group consisting of aluminum, silicon, tin, lead, antimony and bismuth elements and their oxides. Particularly preferred inorganic filler is one or more inorganic fillers selected from the group consisting of oxides, sulfates, phosphates and silicates of the Group II elements of the periodic table.

The oxides of the Group II elements of the periodic table include magnesium oxide, calcium oxide, barium oxide and zinc oxide. The phosphates include magnesium phosphate, calcium phosphate, barium phosphate, zinc phosphate, magnesium pyrophosphate and calcium pyrophosphate. The sulfates include magnesium, calcium and barium sulfates. The silicates include magnesium silicate, calcium silicate, aluminum silicate, kaolin, talc, clay, diatomaceous earth and wollastonite.

These inorganic fillers are particularly preferred in the surface treatment (etching) of the molding with an acid or alkali prior to the surface treatment with the metal. Among them, the phosphates are preferred. In addition, one or more substances selected from the group consisting of aluminum, silicon, tin, lead, antimony and bismuth and their oxides are also preferred. Particularly, amphoteric metals such as zinc, aluminum, tin and lead and oxides of them are preferred.

The amount of the inorganic filler is 5 to 80% by weight, preferably 20 to 70% by weight, based on the whole liquid-crystal polyester resin composition. In case it is less than 5% by weight, nonuniform flow marks are formed on the surface of the molding and a thin film is easily peeled off from the surface of the molding when an adhesive tape is applied to the surface and then stripped and, in addition, the uniform etching of the surface is impossible. In case it exceeds 80% by weight, on the contrary, the fluidity of the resin is reduced and the obtained molding has poor surface conditions and unfavorably reduced mechanical strengths. The inorganic filler is preferably in the form of a fine powder and its average particle diameter is 0.01 to 100 $\mu$m, preferably 0.1 to 30 $\mu$m and still preferably 0.5 to 10 $\mu$m. When the average particle diameter is less than 0.01 $\mu$m, lumps are apt to be formed on the surface of the molding due to an insufficient dispersion and, on the contrary, when it exceeds 100 $\mu$m, the molding has such a poor surface smoothness that the formation of fine lines for a precision circuit by the subtractive method becomes extremely difficult and no good appearance can be obtained.

Fibrous inorganic substances are also preferably used as the inorganic filler and they can be used either singly or in combination with the above-described finely pulverized inorganic filler.

The fibrous inorganic fillers include fibers of glass, milled glass, carbon, asbestos, silica, silica/alumina, alumina, zirconia, boron nitride, silicon nitride, boron, potassium titanate and metals such as stainless steel, aluminum, titanium, copper and brass. Preferably they have a diameter of 1 to 30 $\mu$m and a length of 5 $\mu$m to 1 mm, particularly 10 to 100 $\mu$m.

A particularly preferred fibrous inorganic substance is glass fiber, which is used in an amount ranging from 1 to 60% by weight, preferably 5 to 40% by weight, based on the whole composition for the molding. It has been unexpectedly found that when the glass fiber is used in combination with the above-described inorganic filler, the surface of the molding becomes more uniform and the adhesion of a metallic coating for forming a conductive circuit to the molding is further improved. Milled glass fiber which is ranked between the glass fibers and the finely pulverized glass from the viewpoint of the balance between the surface roughness and the mechanical properties of the material is particularly preferred.

It is not preferred from the viewpoints of the moldability and physical properties that the total amount of the finely pulverized inorganic filler and the fibrous inorganic substance exceeds 85% by weight based on the composition for forming a molding.

In the etching of the molding, an acid or alkali may be used. Suitable representative solvents for use with the acid or alkali include water, alcohol, or mixtures of these. An aqueous solution of mainly an alkali metal hydroxide or alkaline earth metal hydroxide such as sodium hydroxide or potassium hydroxide is preferred. In a preferred embodiment, the etching is conducted with a 40 to 50 wt. % aqueous hydroxide solution at 40° to 60° C. for 5 to 30 min. In a particularly preferred embodiment, the etching is conducted with an about 45 wt. % aqueous potassium hydroxide solution at 60° C. for about 10 min. After the completion of the etching, the molding is immersed in a dilute hydrochloric acid or dilute sulfuric acid solution to neutralize the alkali solution remaining on the surface thereof and to remove the filler from the surface, thoroughly washed with water and dehydrated and dried with hot air at 100° C. or above or with a vacuum dryer.

In addition to the wet etching, an etching which is conducted in vacuo from the initial stage, such as plasma etching, sputter etching or ion etching is also preferred.

In these methods, the molded base plate is physically etched by energitic particles in the vacuum tank. These methods are classified as described above according to the manner of the treatment.

The term "plasma etching" herein refers to the following method of the treatment: a plasma treatment tank of a plasma treatment apparatus is evacuated to about $1 \times 10^{-5}$ Torr, a very small amount of a gas is introduced thereinto (flow rate: 50 SCCM) and the gas atoms are excited by, for example, a high-frequency (radio wave: 13.56 MHz) electrode to form a plasma.

The molded base plate is exposed to the plasma atmosphere to attack the surface thereof with the plasma to thereby physically roughen it. In the sputter etching method, a very small amount of an inert gas is introduced into a vacuum tank of a sputter etching device, a high-frequency current or a high-voltage direct current is applied thereto to cause discharge, a cation of the inert gas thus formed is attracted to and impinged against the cathode, and the base plate is etched by the impact caused by the impingement. In the ion etching method, the same procedure as described above is repeated in an ion plating apparatus.

The term "treatment of the surface to form a metallic coating" as used herein means a dry metal coating process to be conducted in vacuo. In particular, it means a process wherein a metallic coating is directly formed on a resin molding by any of sputtering, ion plating and vacuum deposition.

The liquid-crystal polyester used in the present invention is characterized in that the amount of a gas generated from it in a reduced pressure chamber is smaller than that generated from other materials. Although a thin metallic coating firmly adherent to the resin surface can be prepared merely by sputtering, ion plating or vacuum adhesion, the gas thus generated from the resin molding can be eliminated by heating and the hardness of the surface is reduced at the elevated temperature to further improve the adhesion of the metal atoms to the resin surface. The surface treatment with the metal is desirably conducted under a reduced pressure of $10^{-5}$ to $10^{-7}$ Torr in the reduced pressure chamber.

Although the minimum possible line width and minimum possible space width of the conventional circuit were both 0.30 mm as described above, both of them can be reduced to 0.25 mm or below by the process of the present invention for the surface treatment with the metal. Further according to the process of the present invention, the circuit has a high adhesion and a precision fine-line circuit can be produced by the subtractive method.

The liquid-crystal polyester of the present invention is a melt-processable polyester. Its molecular chains are regularly arranged in parallel in a molten state. Such an arranged state of the molecules is called a liquid crystal or a nematic phase of a liquid-crystal substance. These polymer molecules are usually slender and flat and have a considerably high rigidity along the major axes of the molecules. The polymer usually has chain-extending linkages which are coaxial or in parallel.

The properties of the anisotropic molten phase can be confirmed by an ordinary polarimetric method using crossed nicols. In particular, the anisotropic molten phase can be confirmed by observing a molten sample thereof placed on a Leitz hot stage of a Leitz polarizing microscope at ×40 magnification in a nitrogen atmosphere. The polymer of the present invention transmits polarized light even in a molten static state when it is inspected between crossed nicols, i.e., it is optically anisotropic.

The liquid-crystal polymers suitably used in the present invention are substantially insoluble in an ordinary solvent and, therefore, unsuitable for the solution processing. However, these polymers can be easily worked by an ordinary melt processing method as described above.

Preferable polymers capable of forming an anisotropic molten phase used in the present invention are not only aromatic polyesters and aromatic polyesteramides but also polyesters partially comprising an aromatic polyester and an aromatic polyesteramide in the same molecular chain.

Particularly preferred are liquid-crystal aromatic polyesters and liquid-crystal aromatic polyesteramides comprising as a constituent at least one compound selected from the group consisting of aromatic hydroxy carboxylic acids, aromatic hydroxy amines and aromatic diamines.

In particular, the polymers used in the present invention include:

1) polyesters mainly comprising one or more compounds selected from the group consisting of aromatic hydroxy carboxylic acids and derivatives thereof, 2) polyesters mainly comprising:
   a) one or more compounds selected from the group consisting of aromatic hydroxy carboxylic acids and derivatives thereof,
   b) one or more compounds selected from the group consisting of aromatic dicarboxylic acids, alicyclic dicarboxylic acids and derivatives thereof, and
   c) one or more compounds selected from the group consisting of aromatic diols, alicyclic diols, aliphatic diols and derivatives thereof, 3) polyesteramides mainly comprising:
   a) one or more compounds selected from the group consisting of aromatic hydroxy carboxylic acids and derivatives thereof,
   b) one or more compounds selected from the group consisting of aromatic hydroxy amines, aromatic diamines and derivatives thereof, and
   c) one or more compounds selected from the group consisting of aromatic dicarboxylic acids, alicyclic dicarboxylic acids and derivatives thereof, and 4) polyesteramides mainly comprising:
   a) one or more compounds selected from the group consisting of aromatic hydroxy carboxylic acids and derivatives thereof,
   b) one or more compounds selected from the group consisting of aromatic hydroxy amines, aromatic diamines and derivatives thereof,
   c) one or more compounds selected from the group consisting of aromatic dicarboxylic acids, alicyclic dicarboxylic acids and derivatives thereof, and
   d) one or more compounds selected from the group consisting of aromatic diols, alicyclic diols, aliphatic diols and derivatives thereof.

Preferred examples of the compounds constituting the liquid-crystal polyesters of the present invention include naphthalene compounds such as 2,6-naphthalenedicarboxylic acid, 2,6-dihydroxynaphthalene, 1,4-dihydroxynaphthalene and 6-hydroxy-2-naphthoic acid; biphenyl compounds such as 4,4'-diphenyldicarboxylic acid and 4,4'-dihydroxybiphenyl; compounds represented by the following general formulae (I), (II) or (III):

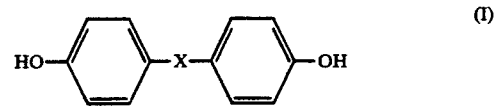

(I)

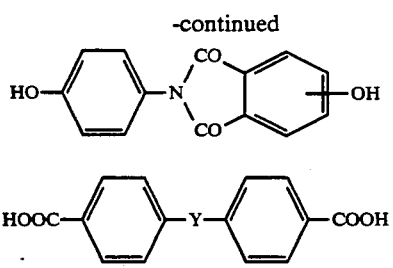

(II)

(III)

wherein X represents an alkylene group having 1 to 4 carbon atoms, an alkylidene group, —O—, —SO—, —SO$_2$—, —S— or —CO—, and wherein X represents an alkylene group having 1 to 4 carbon atoms, an alkylidene group, —O—, —SO—, —SO$_2$—, —S— or —CO—, and Y represents —(CH$_2$)$_n$— in which n is 1 to 4 or —O(CH$_2$)$_n$O— in which n is 1 to 4;
p-substituted benzene compounds such as p-hydroxybenzoic acid, terephthalic acid, hydroquinone, p-aminophenol and p-phenylenediamine each having a nucleus which may be substituted with a chlorine, bromine, methyl, phenyl or 1-phenylethyl group; and m-substituted benzene compounds such as isophthalic acid and resorcinol.

The liquid-crystal polyester used in the present invention may comprise, in addition to the above-described constituents, a polyalkylene terephthalate which does not form any anisotropic molten phase in the same molecular chain. The alkyl group of the polyalkylene terephthalate has 2 to 4 carbon atoms.

Among the above-described constituents, one or more compounds selected from the group consisting of the naphthalene compounds, biphenyl compounds and p-substituted benzene compounds are preferably used as the indispensable constituents. Among the p-substituted benzene compounds, particularly preferred are p-hydroxybenzoic acid, methylhydroquinone and 1-phenylethylhydroquinone.

Examples of the compounds having ester forming functional groups as the constituent and polyesters capable of forming an anisotropic molten phase preferably used in the present invention are described in Japanese Patent Publication No. 36633/1988.

The liquid-crystal polyesters preferably used in the present invention have usually a weight-average molecular weight of about 2,000 to 200,000, preferably about 10,000 to 50,000 and particularly preferably about 20,000 to 25,000. The preferred aromatic polyesteramides have a molecular weight of usually about 5,000 to 50,000, preferably about 10,000 to 30,000, for example, 15,000 to 17,000. The molecular weight can be determined by gel permeation chromatography or another standard method wherein no polymer solution is formed, such as infrared spectrophotometry wherein the terminal group of a compression-molded film is determined. In another method of determining the molecular weight, the molecular weight is determined by dissolving the sample in pentafluorophenol by the light scattering method.

A 0.1 wt. % solution prepared by dissolving the aromatic polyester or polyesteramide in pentafluorophenol at 60° C. has usually an inherent viscosity (I.V.) of at least about 2.0 dl/g, for example, about 2.0 to 10.0 dl/g.

In the present invention, the above-described inorganic fillers (finely pulverized inorganic filler and fibrous inorganic substance) can be used in combination with various inorganic substances in order to improve the properties of the product. These inorganic substances are preferably used to form a molding having excellent mechanical properties, thermal resistance and dimensional stability (resistance to deformation and warping). The inorganic substances used may be powdery, granular or platy depending on the purpose.

The powdery or granular inorganic substances include carbon black, graphite, silica, quartz powder, glass beads, glass balloons, glass powder, metal oxides such as iron oxides, ferrite, silicon carbide, silicon nitride and boron nitride.

The platy inorganic substances include mica, glass flake and various metal foils.

These inorganic substances to be used in combination with the inorganic filler are used either alone or in combination of two or more of them.

It is not preferred from the viewpoints of moldability and properties of the product that the total amount of the inorganic filler and the inorganic substance exceeds 85% by weight based on the composition to be molded. It is desirable to use the inorganic filler and the inorganic substance in combination with a binder or surface treatment, if desired.

Another thermoplastic resin can be incorporated into the composition of the present invention so far as the object of the invention is not hindered within the scope of the present invention.

The thermoplastic resins usable herein are not particularly limited. They include polyolefins such as polyethylene and polypropylene, polyacetals (homopolymers and copolymers), polystyrene, polyvinyl chloride, polyacrylic esters and copolymers of them, polyamides, polycarbonates, ABS, polyphenylene oxides, polyphenylene sulfides and fluororesins. The thermoplastic resins can be used either alone or in the form of a mixture of two or more of them.

The resin composition may further contain known additives usually added to thermoplastic and thermosetting resins such as a plasticizer, stabilizer (such as antioxidant or ultraviolet absorber), antistatic agent, surface modifier, surfactant, flame retardant, colorant (such as dye or pigment), lubricant for improving the fluidity and releasability and crystallization promoter (necleating agent) depending on the required properties.

The molding produced by the process of the present invention is, for example, a board for use in forming a pin grid array (PGA), a board having a pin inserted thereinto or a molded board for use in forming a printed wiring board and the shape thereof is not particularly limited and is a plate, cube, film or sheet.

As described above, according to the process of the present invention for the surface treatment of a liquid-crystal polyester resin molding with a metal, wherein the etching pretreatment is conducted, a precision fine-line circuit (having a line width of 0.25 mm or below and a space width of 0.25 mm or below) can be produced by the subtractive method. The surface layer of the product is not easily peeled off. The product has a uniform, dense surface structure. The adhesion of the metallic coating to the surface is higher than that obtained without the etching treatment. The problem of peeling at a high temperature which is caused by a difference in the thermal expansion coefficient between the resin and the metal is solved, though the inhibition of the peeling has been difficult when an ordinary thermoplastic resin is used. The dipping in a soldering bath (time: about 10 sec) is also possible. Thus the process of the present invention can be applied to the fields related to printed circuit moldings.

EXAMPLES

The following Examples will further illustrate the present invention, which by no means limit the invention.

The liquid-crystal polyesters A to F used in the Examples comprised the following structural units:

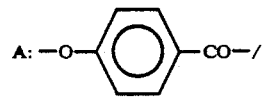

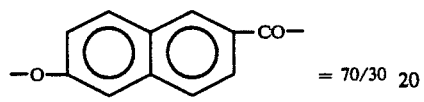

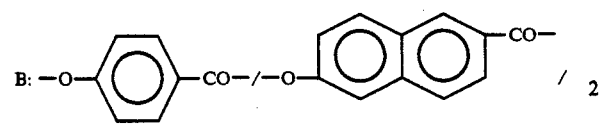

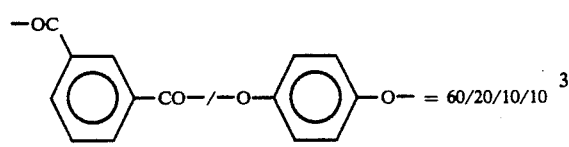

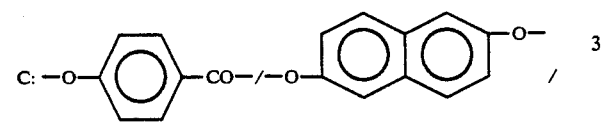

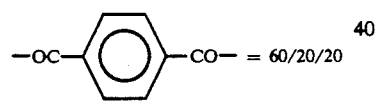

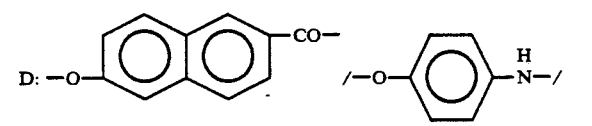

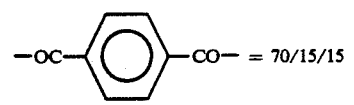

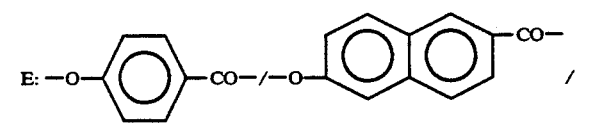

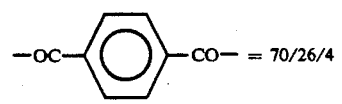

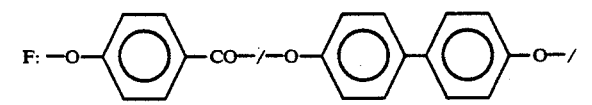

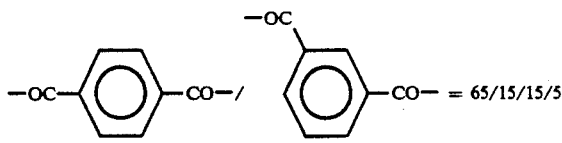

(The numerals refer to the molar ratio).

EXAMPLES 1 TO 12 AND COMPARATIVE EXAMPLES 1 TO 7

On of liquid-crystal polyester resins A to F which will be described below was kneaded together with a filler listed in Tables 1 and 2 in amounts specified in Tables 1 and 2 in terms of % by weight based on the whole composition by melt bending with an extruder to form pellets. The pellets were dried at 140° C. for 3 h and molded into flat plates having a size of 50 mm×70 mm×3 mm with a molding machine having a mold of a controlled temperature.

The flat plates (base plates) thus formed were subjected to an etching pretreatment as described below and then to the surface metal coating treatment by the following methods:

1) vacuum deposition: the above plate was placed in a reduced pressure chamber of a vacuum deposition apparatus (EX 500; mfd. by ULVAC Corporation) and the tank was evacuated to $4 \times 10^{-6}$ Torr.

The surface temperature of the molding was adjusted to a predetermined value with a halogen lamp for heating the molding placed in the chamber. Metallic copper was evaporated with electron beams to form a thin metallic copper coating (thickness: 3 to 5 μm) on the surface of each plate. After the completion of the deposition, the formed board was cooled and taken out.

2) Sputtering: the molding was placed in a reduced pressure chamber of a sputtering apparatus (8ES: mfd. by Tokuda Seisakujo Ltd.). After evacuation to $3 \times 10^{-6}$ Torr, argon gas was introduced thereinto and the equilibrium pressure was adjusted to $5 \times 10^{-3}$ Torr. After the plate temperature was adjusted to a predetermined value with a halogen lamp, the plate was rotated at 10 rpm and the molding set on the plate was subjected to sputtering with a metallic copper target 100 mm distant from the molding to form a thin metallic copper coating.

3) Ion plating: a reduced pressure chamber of an arc discharge type ion plating apparatus (AIF-850 SB; mfd. by Shinko Seiki Co., Ltd.) was evacuated to $3 \times 10^{-6}$ Torr. The temperature of the molding on the plate set in the chamber was adjusted to a predetermined value and a thin metallic copper coating was formed thereon by ion plating. The ionization current was 100 mA and the vacuum deposition rate was 0.5 μm/min.

The etching was conducted by the following methods:

1) plasma etching: a reduced pressure chamber of a plasma treatment apparatus (PV-10 S; mfd. by Samco International Inc.) was evacuated to $1 \times 10^{-6}$ Torr. Oxygen gas was introduced thereinto (flow rate: 50 SCCM) to form an oxygen plasma therein with a high-frequency electrode apparatus (13.56 MHz) and the surface of the flat plate was physically roughened with the plasma. The treatment conditions comprised 170 W×10 min (the level of vacuum in an oxygen atmosphere: $6 \times 10^{-2}$ Torr). The temperature of the base plate was 35° C.

2) Sputter etching: a reduced pressure chamber of a sputtering apparatus (8 ES; mfd. by Tokuda Seisakujo Ltd.) was evacuated to an order of $10^{-6}$ Torr. Argon gas was introduced thereinto at a rate controlled so that the degree of vacuum would be $1 \times 10^{-3}$ Torr. A negative voltage was applied to a holder of the molding to conduct discharge. The molding on the base plate was etched with the plasma cation for 10 min.

The temperature of the base plate was 30° C.

3) Ion etching: an ion plating apparatus was used. Before conducting the ion plating, the reduced pressure chamber thereof was evacuated to an order of $10^{-6}$ Torr. Argon gas was introduced into the chamber. A direct current voltage (1.3 kV) was applied between the base plate to which the molding was fixed and an opposing electrode so that the plate side would be negative to conduct the ion etching by an ion bombardment with argon gas.

This treatment was conducted for 10 min under conditions comprising a level of vacuum of the argon gas atmosphere of $10^{-3}$ Torr, a base plate temperature of 200° C. and a current value of 0.3 mA.

4) Alkali etching: the molding was degreased and the surface of the molding was etched with an alkali bath and washed with water. It was then immersed in a dilute hydrochloric acid solution to neutralize a remaining alkali, washed with water and dried at 150° C. for 1 h.

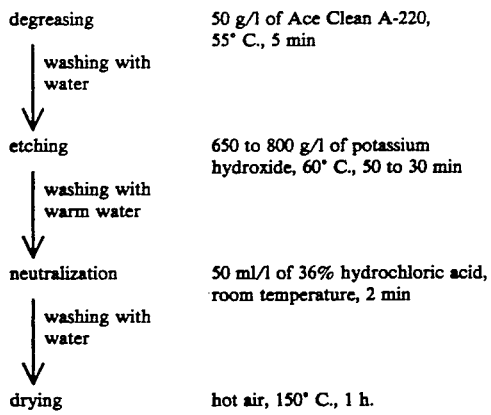

Immediately after the surface treatment with the metal, the molded plate was electroplated with copper to form a metallic coating having a thickness of 30 to 40 μm, since the peeling strength of the plate per se could not be determined. It was cut into strips having a width of 5 mm with a knife and the peeling strength of the strip was measured with a spring scale. The peeling rate was 50 mm/min. The results are shown in Tables 1 and 2.

TABLE 1

| Ex. No. or Comp. Ex. No. | Material | | | Pretreatment of molding | Surface treatment with metal[1] | Adhesion of metallic coating (kg/cm) | Critical fine-line circuit width[2] [line/space (mm)] |
|---|---|---|---|---|---|---|---|
| | polymer | filler (1) | filler (2) | | | | |
| Ex. 1 | A (50) | milled glass fiber (50) | — | plasma etching | vacuum deposition | 1.40 | 0.20/0.20 |
| Comp. Ex. 1 | A (50) | milled glass fiber (50) | — | — | vacuum deposition | 0.10 | 0.20/0.20 |
| Ex. 2 | A (50) | milled glass fiber (50) | — | ion etching | ion plating | 1.40 | 0.15/0.15 |
| Comp. Ex. 2 | A (50) | milled glass fiber (50) | — | — | ion plating | 0.25 | 0.20/0.20 |
| Ex. 3 | A (50) | milled glass fiber (50) | — | sputter etching | sputtering | 1.35 | 0.20/0.15 |
| Comp. Ex. 3 | A (50) | milled glass fiber (50) | — | sputter etching | sputtering | 0.20 | 0.15/0.15 |
| Ex. 4 | A (50) | milled glass fiber (15) | calcium pyrophosphate (35) | alkali etching 50% KOH (60° C., 15 min) | vacuum deposition | 1.60 | 0.25/0.25 |
| Comp. Ex. 4 | A (50) | milled glass fiber (15) | calcium pyrophosphate (35) | — | vacuum deposition | 0.15 | 0.20/0.20 |
| Ex. 5 | A (50) | milled glass fiber (15) | calcium pyrophosphate (35) | alkali etching 40% NaOH (60° C., 15 min) | sputtering | 1.40 | 0.20/0.20 |
| Comp. Ex. 5 | A (50) | milled glass fiber (15) | calcium pyrophosphate (35) | — | sputtering | 0.10 | 0.20/0.20 |
| Ex. 6 | B (50) | milled glass fiber (50) | — | alkali etching 40% NaOH (60° C., 15 min) | ion plating | 1.50 | 0.20/0.20 |
| Ex. 7 | C (50) | milled glass fiber (50) | — | alkali etching 40% NaOH (60° C., 15 min) | ion plating | 1.45 | 0.20/0.15 |
| Ex. 8 | D (50) | milled glass fiber (50) | — | alkali etching 40% NaOH (60° C., 15 min) | ion plating | 1.45 | 0.20/0.20 |
| Ex. 9 | E (50) | milled glass fiber (50) | — | alkali etching 40% NaOH (60° C., 15 min) | ion plating | 1.40 | 0.20/0.20 |
| Ex. 10 | F (50) | milled glass fiber (50) | — | alkali etching 40% NaOH (60° C., 15 min) | ion plating | 1.50 | 0.20/0.15 |

[1]Base plate temperature: 40° C.
[2]The critical fine-line circuit width was defined as a critical value at which no defect could be recognized in microscopic observation (×20 magnification) of linear-pattern plated products having varied line/space widths.

TABLE 2

| Ex. No. or Comp. Ex. No. | Material | | | Pretreatment of molding | Surface treatment with metal*1 | Adhesion of metallic coating (kg/cm) | Critical fine-line circuit width*2 [line/space (mm)] |
| --- | --- | --- | --- | --- | --- | --- | --- |
| | polymer | filler (1) | filler (2) | | | | |
| Ex. 11 | A (50) | — | calcium pyrophosphate (50) | 43% KOH 60° C., 10 min | vacuum deposition | 1.30 | 0.15/0.15 |
| Ex. 12 | A (50) | milled glass fiber (15) | calcium pyrophosphate (35) | plasma etching O₂ atmosphere 40° C., 5 min | vacuum deposition | 1.20 | 0.15/0.10 |
| Comp. Ex. 6 | A (50) | milled glass fiber (15) | calcium pyrophosphate (35) | alkali etching 45 wt. % KOH 70° C., 30 min | wet plating | 1.50 | 0.35/0.30 |
| Comp. Ex. 7 | A (50) | milled glass fiber (15) | calcium pyrophosphate (35) | alkali etching 45 wt. % KOH 70° C., 5 min | wet plating | 0.10 | 0.10/0.05 |

*1 Base plate temperature: 40° C.
*2 The critical fine-line circuit width was defined as a critical value at which no defect could be recognized in microscopic observation (×20 magnification) of linear-pattern plated products having varied line/space widths.

We claim:

1. An improved process for producing a metal coated molding capable of forming a precision fine-line circuit by the substractive method comprising providing a base molding formed from a composition comprising (a) a melt-processable polyester which is capable of forming an anisotropic melt phase and (b) an inorganic filler in a concentration of approximately 5 to 80 percent by weight based upon the total weight of the composition; etching at least a portion of said base molding; and applying a metallic surface coating having line and space widths of 0.25 mm or below and a peeling strength of at least one kg/cm to said etched portion of said base molding by a dry metal coating technique selected from the group consisting of sputtering, ion plating, and vacuum deposition while maintaining said base molding at a temperature of approximately 20° to 45° C., in a reduced pressure chamber.

2. A process for producing a metal-coated molding capable of forming a precision fine-line circuit according to claim 1 wherein said melt-processable polyester which is capable of forming an anisotropic melt phase exhibits an inherent viscosity of at least 2.0 dl./g. when dissolved in pentafluorophenol in a concentration of 0.1 percent by weight at 60° C.

3. A process for producing a metal-coated molding capable of forming a precision fine-line circuit according to claim 1 wherein said melt-processable polyester which is capable of forming an anisotropic melt phase exhibits an inherent viscosity of 2.0 to 10.0 dl./g. when dissolved in pentafluorophenol in a concentration of 0.1 percent by weight at 60° C.

4. A process for producing a metal-coated molding capable of forming a precision fine-line circuit according to claim 1 wherein said melt-processable polyester which is capable of forming an anisotropic melt phase consists essentially of approximately 70 mole percent of recurring 4-oxybenzoyl units and approximately 30 mole percent of recurring 6-oxy-2-naphthoyl units.

5. A process for producing a metal-coated molding capable of forming a precision fine-line circuit according to claim 1 wherein said inorganic filler is selected from the group consisting of Group II elements of the periodic table; the oxides, sulfates, phosphates, silicates and carbonates of the Group II elements of the periodic table; aluminum, silicon, tin, lead, antimony, and bismuth and their oxides; and mixtures of any of the foregoing.

6. A process for producing a metal-coated molding capable of forming a precision fine-line circuit according to claim 1 wherein said inorganic filler is selected from the group consisting of oxides, sulfates, phosphates and silicates of Group II elements of the periodic table.

7. A process for producing a metal-coated molding capable of forming a precision fine-line circuit according to claim 1 wherein said inorganic filler is present in said composition in a concentration of approximately 20 to 70 percent by weight based on the total weight of the composition.

8. A process for producing a metal-coated molding capable of forming a precision fine-line circuit according to claim 1 wherein said inorganic filler exhibits an average particle diameter of 0.01 to 100 μm.

9. A process for producing a metal-coated molding capable of forming a precision fine-line circuit according to claim 1 wherein said inorganic filler exhibits an average particle diameter of 0.1 to 30 μm.

10. A process for producing a metal-coated molding capable of forming a precision fine-line circuit according to claim 1 wherein said inorganic filler exhibits an average particle diameter of 0.5 to 10 μm.

11. A process for producing a metal-coated molding capable of forming a precision fine-line circuit according to claim 1 wherein said inorganic filler is a fibrous inorganic substance having a diameter of 1 to 30 μm and a length of 5 μm to 1 mm, and the amount thereof is 1 to 60 percent by weight based upon the total weight of the composition.

12. A process for producing a metal-coated molding capable of forming a precision fine-line circuit according to claim 11 wherein said fibrous inorganic substance is glass fiber.

13. A process for producing a metal-coated molding capable of forming a precision fine-line circuit according to claim 1 wherein said inorganic filler is the combination of at least one finely pulverized inorganic filler and at least one fibrous inorganic filler.

14. A process for producing a metal-coated molding capable of forming a precision fine-line circuit according to claim 1 wherein said base molding is formed by a technique selected from the group consisting of injection molding, extrusion molding and compression molding.

15. A process for producing a metal-coated molding capable of forming a precision fine-line circuit according to claim 1 wherein an acid is utilized to accomplish said etching.

16. A process for producing a metal-coated molding capable of forming a precision fine-line circuit according to claim 1 wherein an alkali is utilized to accomplish said etching.

17. A process for producing a metal-coated molding capable of forming a precision fine-line circuit according to claim 16 wherein said alkali is selected from the group consisting of sodium hydroxide and potassium hydroxide and is provided in an aqueous solution at an elevated temperature when contacted with said base molding.

18. A process for producing a metal-coated molding capable of forming a precision fine-line circuit according to claim 1 wherein said etching is accomplished by a technique selected from the group consisting of plasma etching, sputter etching, and ion etching.

19. A process for producing a metal-coated molding capable of forming a precision fine-line circuit according to claim 1 wherein said base molding is metal coated while at a temperature of approximately 40° C. in a reduced pressure zone.

20. A process for producing a metal-coated molding capable of forming a precision fine-line circuit according to claim 1 wherein said base molding is a board for use in forming a pin grid array.

21. A process for producing a metal-coated molding capable of forming a precision fine-line circuit according to claim 1 wherein said base molding following said etching is dried prior to placement in said reduced pressure chamber where said metallic surface coating is applied.

* * * * *